United States Patent
Guo et al.

(10) Patent No.: US 10,340,145 B2
(45) Date of Patent: Jul. 2, 2019

(54) INTEGRATED CIRCUIT ELEMENT AND FABRICATING METHOD THEREOF, CIRCUIT BOARD, DISPLAY PANEL AND DISPLAY DEVICE

(71) Applicant: BOE TECHNOLOGY GROUP CO., LTD., Beijing (CN)

(72) Inventors: Yuzhen Guo, Beijing (CN); Xue Dong, Beijing (CN); Haisheng Wang, Beijing (CN); Chunwei Wu, Beijing (CN); Yingming Liu, Beijing (CN); Xiaoliang Ding, Beijing (CN); Rui Xu, Beijing (CN); Changfeng Li, Beijing (CN); Lijun Zhao, Beijing (CN); Yanling Han, Beijing (CN); Pengpeng Wang, Beijing (CN); Xueyou Cao, Beijing (CN); Ping Zhang, Beijing (CN); Wei Liu, Beijing (CN); Yanan Jia, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/662,896

(22) Filed: Jul. 28, 2017

(65) Prior Publication Data
US 2018/0033629 A1 Feb. 1, 2018

(30) Foreign Application Priority Data

Jul. 29, 2016 (CN) .......................... 2016 1 0617929

(51) Int. Cl.
| | | |
|---|---|---|
| *H05K 1/11* | (2006.01) | |
| *H01L 23/00* | (2006.01) | |
| *H01L 21/28* | (2006.01) | |
| *G01R 1/04* | (2006.01) | |
| *H01L 21/31* | (2006.01) | |

(Continued)

(52) U.S. Cl.
CPC ............ *H01L 21/28* (2013.01); *G01R 1/0433* (2013.01); *G02F 1/13454* (2013.01); *H01L 21/31* (2013.01); *H01L 23/32* (2013.01); *H01L 24/11* (2013.01); *H01L 24/13* (2013.01); *H05K 1/11* (2013.01); *H05K 1/147* (2013.01)

(58) Field of Classification Search
CPC .......... H05K 1/11; H05K 1/111; H01L 24/11; H01L 24/13
USPC ...................................... 257/59, 72
See application file for complete search history.

(56) References Cited

U.S. PATENT DOCUMENTS

| | | | | |
|---|---|---|---|---|
| 5,528,403 A | * | 6/1996 | Kawaguchi | ......... G02F 1/13452 349/149 |
| 2007/0045841 A1 | * | 3/2007 | Cho | .................... H01L 23/3171 257/737 |

(Continued)

*Primary Examiner* — David Vu
*Assistant Examiner* — Brandon C Fox
(74) *Attorney, Agent, or Firm* — Brooks Kushman P.C.

(57) ABSTRACT

An integrated circuit element and a fabrication method thereof, a circuit board, a display panel and a display device are provided, to reduce space occupied by the integrated circuit element and facilitate achieving intelligent transparent display by arranging the integrated circuit element in a display. The integrated circuit element includes a base plate, and a bare integrated circuit chip and multiple connection parts arranged on the base plate. The bare integrated circuit chip includes multiple connection points that are respectively electrically connected to the multiple connection parts.

20 Claims, 3 Drawing Sheets

(51) Int. Cl.
*H01L 23/32* (2006.01)
*H05K 1/14* (2006.01)
*G02F 1/1345* (2006.01)

(56) References Cited

U.S. PATENT DOCUMENTS

| | | | |
|---|---|---|---|
| 2007/0176234 A1* | 8/2007 | Yamazaki | G11C 17/12 |
| | | | 257/347 |
| 2015/0370113 A1* | 12/2015 | Kim | G02F 1/13336 |
| | | | 361/679.21 |
| 2016/0291759 A1* | 10/2016 | Kurasawa | G06F 3/0412 |
| 2017/0048976 A1* | 2/2017 | Prevatte | H01L 24/11 |
| 2017/0061867 A1* | 3/2017 | Cok | G09G 3/3208 |
| 2017/0186740 A1* | 6/2017 | Cok | H01L 27/0207 |
| 2017/0338542 A1* | 11/2017 | Cok | G06K 19/077 |

* cited by examiner

INTEGRATED CIRCUIT ELEMENT AND FABRICATING METHOD THEREOF, CIRCUIT BOARD, DISPLAY PANEL AND DISPLAY DEVICE

CROSS REFERENCE TO RELATED APPLICATION

This application claims a priority to Chinese patent application No. 201610617929.8, filed with the Chinese State Intellectual Property Office on Jul. 29, 2016, which is incorporated herein by reference in its entirety.

FIELD

The present disclosure relates to the field of displaying technologies, and in particular, to an integrated circuit element and a fabricating method thereof, a circuit board, a display panel and a display device.

BACKGROUND

With rapid development of displaying technologies, the display can achieve more and more functions mainly by arranging silicon-based integrated circuit elements having various functions in the display. For example, silicon-based sensors having automatic detecting function and automatic control function can be arranged in the display.

The production chain of silicon-based integrated circuit elements mainly includes a wafer factory and an encapsulating and testing factory. Hereinafter, it is explained by taking a silicon-based sensor as an example, which refers to an integrated circuit element that has a sensing function and is fabricated based on a silicon-based process. The wafer factory fabricates bare sensor chips based on the silicon-based process and the encapsulating and testing factory encapsulates the bare sensor chips, thereby realizing mechanical supporting, environmental protection or electrical connection for the sensors.

In the whole production chain of the sensors, the cost of encapsulation takes 70 to 80 percentages of the cost of whole cost of the sensors. Furthermore, after encapsulation, the size of the sensor is increased; for example, a bare temperature sensor is in a scale of 300 to 400 micrometers while an encapsulated temperature sensor is in a scale of 1 millimeter or more.

In view of the above, silicon-based integrated circuit elements in related technologies occupy too much space; in addition, a non-transparent material is usually utilized to perform the encapsulation, such that the silicon-based integrated circuit elements arranged in the display may adversely affect intelligent transparent display.

SUMMARY

An integrated circuit element and a fabricating method thereof, a circuit board, a display panel and a display device are provided according to embodiments of the present disclosure, to reduce space occupied by the integrated circuit elements and to facilitate achievement of intelligent transparent display while applying the integrated circuit element into a display.

An integrated circuit element is provided according to some embodiments of the present disclosure, including a base plate, and a plurality of connection parts and a bare integrated circuit chip arranged on the base plate. The bare integrated circuit chip comprises a plurality of connection points, and the plurality of connection parts is electrically connected to the plurality of connection points according to a one-to-one correspondence.

With the integrated circuit element provided in the embodiments of the present disclosure, the bare integrated circuit chip is arranged on the base plate, the connection points of the bare integrated circuit chip are electrically connected to the connection parts arranged on the base plate. In this way, unencapsulated bare integrated circuit chip is directly integrated onto the base plate, a conventional encapsulation process is omitted, and the space occupied by the bare integrated circuit chip on the base plate is effectively reduced. In addition, by arranging the integrated circuit chip in the display, achievement of intelligent transparent display can be facilitated.

Optionally, the integrated circuit element further includes a protection layer that is arranged on the bare integrated circuit chip and covers the base plate.

Optionally, the bare integrated circuit chip is a bare sensor chip, a bare operation circuit chip, or a bare semiconductor circuit chip.

A circuit board is provided according to some embodiments of the present disclosure, including the above-mentioned integrated circuit element.

Optionally, the circuit board is a flexible circuit board or a printed circuit board.

A display device is provided according to some embodiments of the present disclosure, including the above-mentioned circuit board.

A display panel is provided according to some embodiments of the present disclosure, including a display substrate, where a bare integrated circuit chip and a plurality of connection parts are arranged at each of at least one side of the display substrate, and the bare integrated circuit chip comprises a plurality of connection points. The plurality of connection parts and the plurality of connection points at an identical side of the display substrate are electrically connected according to a one-to-one correspondence.

Optionally, the display panel further includes a protection layer that is arranged on the bare integrated circuit chip and configured to isolate the bare integrated circuit chip from external environment.

Optionally, the display substrate is an array substrate or a color filter substrate of a liquid crystal display panel, or the display substrate is a backboard or a cover-board of an organic light emitting diode display panel.

Optionally, the bare integrated circuit chip is located in a non-display region of the array substrate or in a non-display region of the color filter substrate, or the bare integrated circuit chip is located in a non-display region of the backboard or in a non-display region of the cover-board.

Optionally, the bare integrated circuit chip is arranged at a side of the array substrate facing toward the color filter substrate; or the bare integrated circuit chip is arranged at a side of the array substrate away from the color filter substrate; or the bare integrated circuit chip is arranged at a side of the color filter substrate facing toward the array substrate; or the bare integrated circuit chip is arranged at a side of the color filter substrate away from the array substrate; or the bare integrated circuit chip is arranged at a side of the backboard facing toward the cover-board; or the bare integrated circuit chip is arranged at a side of the backboard away from the cover-board; or the bare integrated circuit chip is arranged at a side of the cover-board facing toward the backboard; or the bare integrated circuit chip is arranged at a side of the cover-board away from the backboard.

A display device is provided according to some embodiments of the present disclosure, including the above-mentioned display panel.

A fabricating method for an integrated circuit element is provided according to some embodiments of the present disclosure, including: providing a base plate and forming a plurality of connection parts on the base plate; separating a bare integrated circuit chip from a silicon wafer using a microtransfer printing process, where the bare integrated circuit chip comprises a plurality of connection points; and placing, using a microtransfer printing process, the bare integrated circuit chip that is separated from the silicon wafer onto the base plate having the plurality of connection parts and electrically connecting the plurality of connection parts to the plurality of connection points according to a one-to-one correspondence.

With the fabricating method for the integrated circuit element according to embodiments of the present disclosure, the bare integrated circuit chip is separated from the silicon wafer using the microtransfer printing process and then is placed on a prepared base plate using the microtransfer printing process, the connection points of the bare integrated circuit chip are electrically connected to the connection parts arranged on the base plate. In this way, unencapsulated bare integrated circuit chip is directly integrated onto the base plate, a conventional encapsulation process is omitted, and the space occupied by the bare integrated circuit chip on the base plate is effectively reduced. In addition, by arranging the integrated circuit chip in the display, achievement of intelligent transparent display can be facilitated.

Optionally, after the step of electrically connecting the plurality of connection parts to the plurality of connection points according to the one-to-one correspondence, the fabricating method further includes: forming a protection layer that covers the base plate.

Optionally, the step of forming the plurality of connection parts on the base plate includes: depositing a metal film on the base plate; and patterning the metal film to form the plurality of connection parts.

Optionally, the bare integrated circuit chip is separated from the silicon wafer using a stripping approach in the microtransfer printing process.

DETAILED DESCRIPTION

An integrated circuit element and a fabricating method thereof, a circuit board, a display panel and a display device are provided according to embodiments of the present disclosure, to reduce space occupied by the integrated circuit elements and to facilitate achievement of intelligent transparent display while applying the integrated circuit element into a display.

For clarifying technical solutions and advantages of the present disclosure, detailed descriptions of the present disclosure are given hereinafter in conjunction with drawings. Apparently, described embodiments are merely a part of rather than all of the embodiments of the present application. All other embodiment obtained by the ordinary skilled in the art based on the disclosed embodiments herein without any creative efforts shall fall within protection scope of the present disclosure.

An integrated circuit element and a fabricating method thereof according to embodiments of the present application are detailed in conjunction with drawings hereinafter.

Figure 1:
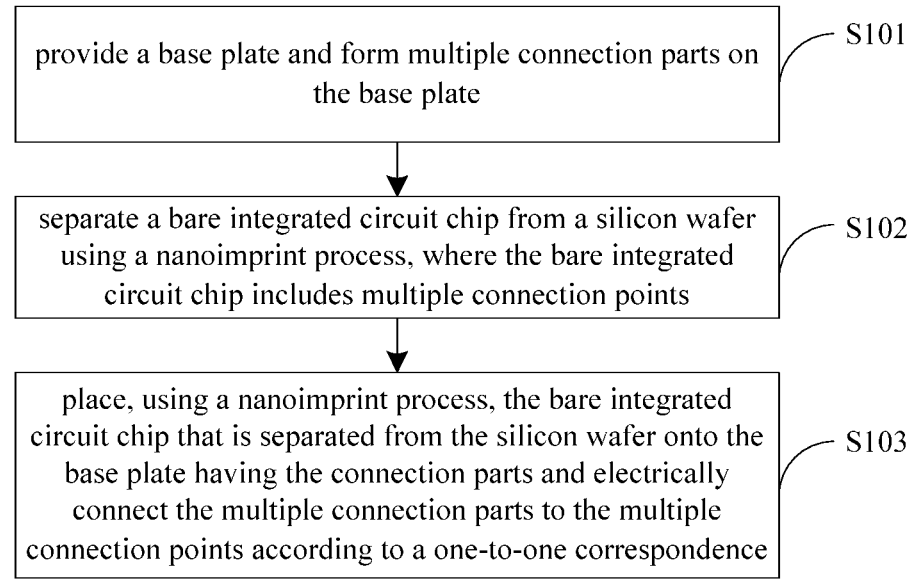
FIG. 1 is a flow chart of a fabricating method for an integrated circuit element according to some embodiments of the present disclosure.

As shown in FIG. 1, a fabricating method for an integrated circuit element is provided according to some embodiments of the present disclosure. The fabricating method includes following steps S101-S103.

S101 is to provide a base plate and form multiple connection parts on the base plate.

S102 is to separate a bare integrated circuit chip from a silicon wafer using a microtransfer printing process, where the bare integrated circuit chip includes multiple connection points.

S103 is to place, using a microtransfer printing process, the bare integrated circuit chip that is separated from the silicon wafer onto the base plate having the connection parts and electrically connect the multiple connection parts to the multiple connection points according to a one-to-one correspondence.

Approach of forming the bare integrated circuit chip on the silicon wafer according to the embodiments of the present disclosure is same as conventional technology, which is not repeated herein. According to some embodiments of the present disclosure, the bare integrated circuit chip may be a bare sensor chip, a bare operation circuit chip, or a bare semiconductor circuit chip; of course, the bare integrated circuit chip may be embodied into other types in practical production. Practically, step S101 may be prior to step S102 or step S102 may be prior to step S101.

Optionally, the base plate according to some embodiments of the present disclosure may be a flexible base plate or a rigid base plate. The base plate according to some embodiments of the present disclosure may be a base plate for an array substrate of a liquid crystal panel, or may be obtained by forming some layers on the base plate for the array substrate; the base plate according to some embodiments of the present disclosure may be a base plate for a color filter substrate of a liquid crystal panel, or may be obtained by forming some layers on the base plate for the color filter substrate; the base plate according to some embodiments of the present disclosure may be a base plate for a backboard of an organic light emitting diode display panel, or may be obtained by forming some layers on the base plate for the backboard; the base plate according to some embodiments of the present disclosure may be a base plate for a cover-board of an organic light emitting diode display panel, or may be obtained by forming some layers on the base plate for the cover-board.

Optionally, according to some embodiments of the present disclosure, the step of forming multiple connection parts on the base plate includes:

depositing a metal film on the base plate; and patterning the metal film to form the multiple connection parts.

The patterning process according to some embodiments of the present disclosure includes: coating a photoresist, exposing the photoresist, developing the photoresist, etching the photoresist, and removing a part of or all the photoresist. Practically, the photoresist may be coated on the metal film and then exposed and developed; after developing, the photoresist at positions of the to-be-formed connection parts is remained while the photoresist at other positions is removed. Then, the base plate is etched and the remained photoresist is removed, to form the multiple connection parts. Locations of the connection parts may be set according to actual production needs, for example, the connection parts may be formed in a periphery region or a center region of the base plate according to some embodiments of the present disclosure.

Optionally, according to some embodiments of the present disclosure, locations of the respective connection parts have a one-to-one correspondence with respective connection points of the bare integrated circuit chip, such that it is convenient to electrically connect the respective connection points to the respective connection parts.

Microtransfer printing process is a relatively advanced nano-assembly technique, which controls a printing head using elastomeric impression and high-precision motion, to selectively pick up an array of micro elements and place the array of micro elements onto a replacement base plate. Firstly, the micro elements are made on a source wafer and are then released by removing a sacrificial layer under a semiconductor circuit; then, a micro-structure elastomeric impression, matching the source wafer, is utilized to pick up a micro chip and place the micro chip onto a target base plate.

Optionally, according to some embodiments of the present disclosure, firstly, the bare integrated circuit chip is separated from the silicon wafer using the microtransfer printing process; then, the bare integrated circuit chip which is separated from the silicon wafer is placed on the base plate using the microtransfer printing process, thereby connecting the respective connection parts to the respective connection points in a one-to-one correspondence.

Preferably, according to some embodiments of the present disclosure, the bare integrated circuit chip is separated from the silicon wafer using a stripping approach in the microtransfer printing process. In this way, the bare integrated circuit chip can be stripped from a surface of the silicon wafer and the obtained bare integrated circuit chip may have a small thickness. Details of the microtransfer printing process are similar to conventional technologies and are not repeated herein.

Optionally, according to some embodiments of the present disclosure, after the step of placing, using the microtransfer printing process, the bare integrated circuit chip that is separated from the silicon wafer onto the base plate having the connection parts and connecting the multiple connection parts to the multiple connection points according to the one-to-one correspondence, the fabricating method further includes: forming a protection layer that covers the base plate. According to some embodiments of the present disclosure, the bare integrated circuit chip is encapsulated by the protection layer. Practically, in the case that multiple bare integrated circuit chips need to be placed on the base plate, according to some embodiments of the present disclosure, all bare integrated circuit chips are placed on the base plate and then one integral protective encapsulation is performed on all the bare integrated circuit chips.

According to the embodiments of the present disclosure, the bare integrated circuit chip is separated from the silicon wafer and directly placed onto a prepared base plate using the microtransfer printing process, and the connection points of the bare integrated circuit chip are electrically connected to the connection parts formed on the base plate. According to the embodiments of the present disclosure, the unencapsulated bare integrated circuit chip is directly integrated onto the base plate and a conventional encapsulation process is not necessary, thereby reducing space occupied by the bare integrated circuit chip on the base plate.

Figure 2:
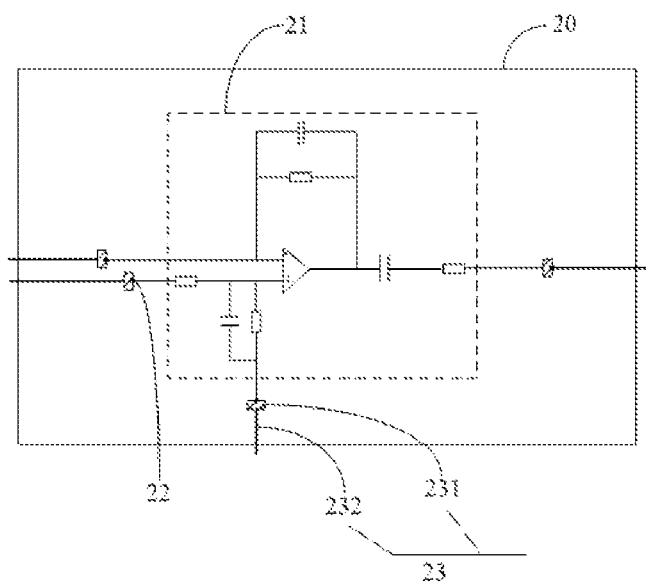
FIG. 2 is a schematic structural diagram of an integrated circuit element according to some embodiments of the present disclosure.

As shown in FIG. 2, an integrated circuit element is provided according to some embodiments of the present disclosure. The integrated circuit element includes: a base plate 20, multiple connection parts 23 arranged on the base plate 20, and a bare integrated circuit chip 21 that is separated from a silicon wafer and includes multiple connection points 22. The multiple connection parts 23 are electrically connected to the multiple connection points 22 according to a one-to-one correspondence.

According to some embodiments of the present disclosure, the bare integrated circuit chip may be a bare sensor chip, a bare operation circuit chip, or a bare semiconductor circuit chip. In order to protect the bare integrated circuit chip 21 on the base plate 20, in some embodiments of the present disclosure, the integrated circuit element further includes a protection layer (not shown in FIG. 2) that is arranged on the bare integrated circuit chip 21 and covers the base plate 20. The protection layer may be detailed later.

Preferably, as shown in FIG. 2, locations of the respective connection parts 23 and locations of the respective connection points 22 have a one-to-one correspondence. In practical production, according to some embodiments of the present disclosure, each connection part 23 includes a connection block 231 and a connection wire 232. The connection block 231 is electrically connected to the connection point 22 of the bare integrated circuit chip 21, and the connection point 22 may be leaded out by the connection wire 232. Practically, the connection point 22 may be electrically connected to other elements on the base plate 20 via the connection wire 232.

The connection wire 232 occupies less space than the connection block 231 and the connection point 22 can be better electrically connected to the connection part 23 via the connection block 231. In view of above, according to the embodiments of the present disclosure, the connection part 23 is designed into the connection block 231 and the connection wire 232, to achieve a better electrical connection between the connection part 23 and the connection point 22 and to reduce the space occupied by the connection part 23 on the base plate 20.

In the embodiments of the present disclosure, a silicon-based bare integrated circuit chip is directly placed on the base plate, the connection points of the bare integrated circuit chip are electrically connected to the connection parts arranged on the base plate. In this way, unencapsulated bare integrated circuit chip is directly integrated onto the base plate, a conventional encapsulation process is omitted, and the space occupied by the bare integrated circuit chip on the base plate is effectively reduced.

A circuit board is provided according to some embodiments of the present disclosure, which includes the integrated circuit element according to foregoing embodiments. Optionally, the circuit board may be a flexible printed circuit (FPC) board or a printed circuit board (PCB). Compared with related technologies, the integrated circuit element according to embodiments of the present disclosure occupies less space on the circuit board and the conventional encapsulation process is not necessary, thereby reducing fabricating cost of the circuit board.

A display device is further provided according to some embodiments of the present disclosure, which includes the circuit board according to the foregoing embodiments.

A display panel is provided according to some embodiments of the present disclosure. The display panel includes: a display substrate, a bare integrated circuit chip and multiple connection parts arranged at each of at least one side of the display substrate. The bare integrated circuit chip includes multiple connection points, and the multiple connection parts are electrically connected to the multiple connection points according to a one-to-one correspondence.

The display panel according to the embodiments of the present disclosure may be a liquid crystal display (LCD) panel or an organic light emitting diode (OLED) display panel. In practical implementation, the display substrate according to some embodiments of the present disclosure may be an array substrate or a color filter substrate of an LCD panel, or a backboard or a cover-board of an OLED display panel.

Relative position relationship between the bare integrated circuit chip and the display substrate is detailed hereinafter based on the drawings. Thicknesses, areas and shapes of respective layers are not limited to what shown in the drawings, and those drawings are merely for schematically explaining the present disclosure.

Figure 3:
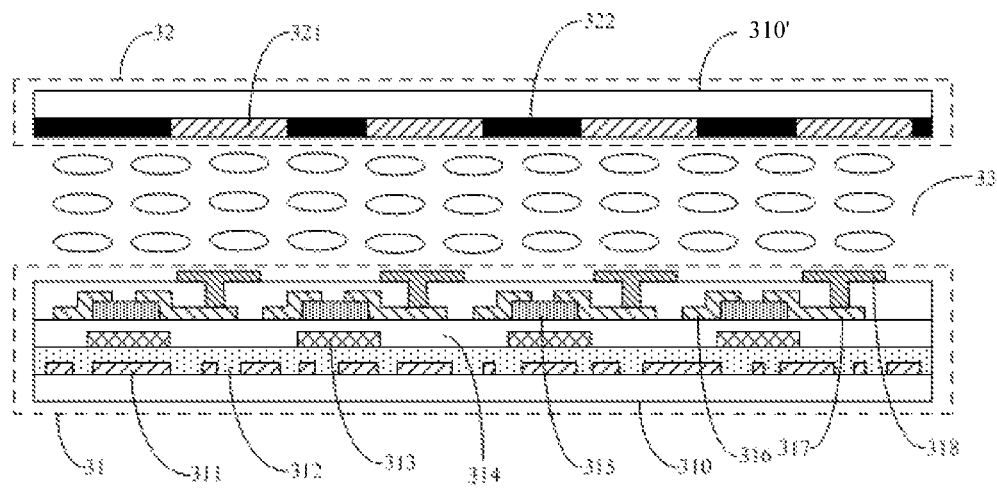
FIG. 3 is a schematic structural diagram of a liquid crystal display panel according to some embodiments of the present disclosure.
Figure 4:
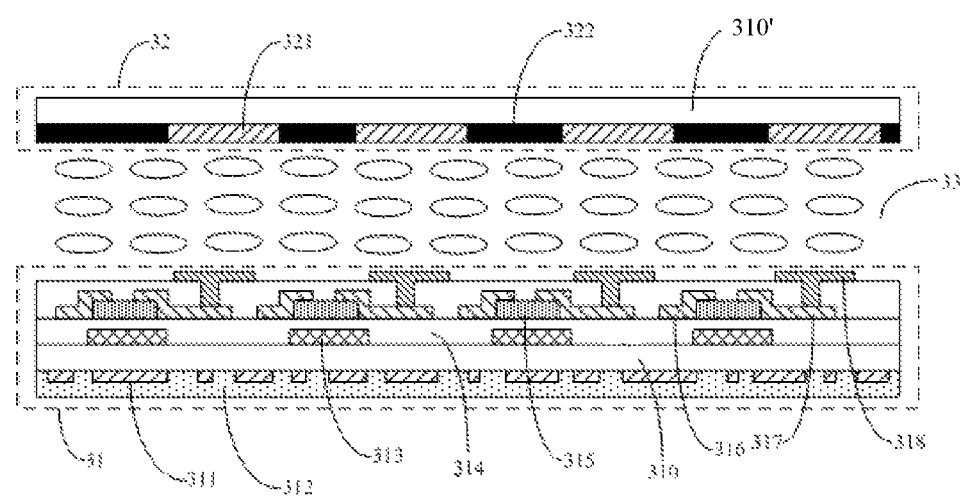
FIG. 4 is a schematic structural diagram of a liquid crystal display panel according to some embodiments of the present disclosure.
Figure 5:
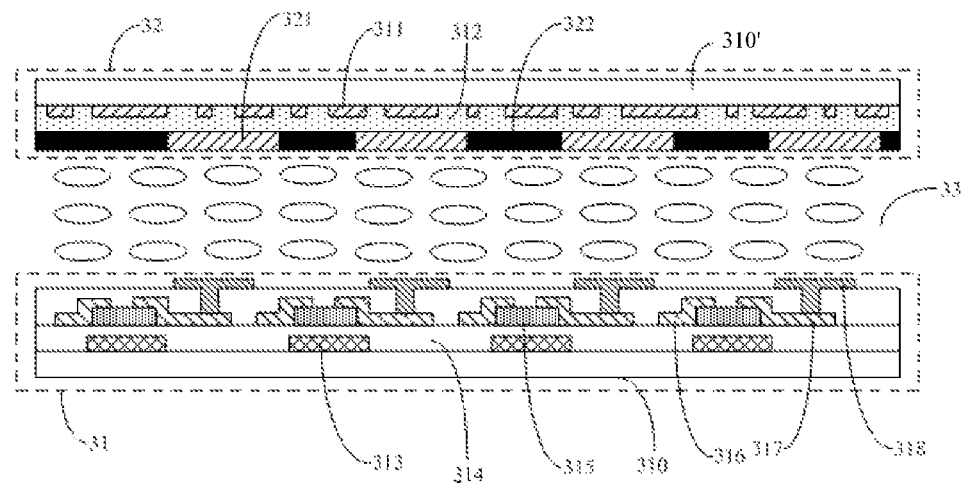
FIG. 5 is a schematic structural diagram of a liquid crystal display panel according to some embodiments of the present disclosure.

According to some embodiments, the display panel is an LCD panel. As shown in FIGS. 3-5, the LCD panel according to the embodiments of the present disclosure includes an array substrate 31 and a color filter substrate 32 opposite to each other, and a liquid crystal layer 33 between the array substrate 31 and the color filter substrate 32. The array substrate 31 includes a base plate 310, and a gate electrode 313, a gate insulating layer 314, a semiconductor active layer 315, a source electrode 316, a drain electrode 317 and a pixel electrode 318 arranged above the base plate 310. The color filter substrate 32 includes a base plate 310' and a black matrix 322 and a color filter layer 321 arranged on the base plate 310'.

Practically, according to some embodiments of the present disclosure, bare integrated circuit chips may be provided in the array substrate 31 or in the color filter substrate 32, or may be provided in both the array substrate 31 and the color filter substrate 32.

According to some embodiments of the present disclosure, the bare integrated circuit chips 311 are provided in the array substrate 31. Optionally, as shown in FIG. 3, the bare integrated circuit chips 311 are arranged on a side of the base plate 310 of the array substrate 31, the side facing toward the color filter substrate 32. Or, as shown in FIG. 4, the bare integrated circuit chips 311 are arranged on a side of the base plate 310 of the array substrate 31, the side being away from the color filter substrate 32. Of course in practical production, a part of the bare integrated circuit chips may be arranged on the side of the base plate 310 of the array substrate 31 away from the color filter substrate 32, and the other of the bare integrated circuit chips may be arranged on the side of the base plate 310 of the array substrate 31 facing toward the color filter substrate 32.

In practical production, as shown in FIG. 3, after arranging the bare integrated circuit chips 311 on the side of the base plate 310 facing toward the color filter substrate 32, a transparent material which is utilized in the fabricating process of the array substrate, such as SiN, Polyimide, epoxy resin and so on, is utilized to form a protection layer 312 on the bare integrated circuit chips 311 to isolate the bare integrated circuit chips 311 from external environment. Since the protection layer 312 is made of transparent material, transmittance of the LCD panel may not be adversely affected. The gate electrode 313 is formed on the protection layer, and the gate insulating layer 314, the semiconductor active layer 315, the source electrode 316, the drain electrode 317 and the pixel electrode 318 are arranged above the protection layer. Processes for forming the gate electrode 313, the gate insulating layer 314, the semiconductor active layer 315, the source electrode 316, the drain electrode 317 and the pixel electrode 318 are similar to related technologies and therefore are not repeated herein.

In practical production, as shown in FIG. 4, after arranging the bare integrated circuit chips 311 on the side of the base plate 310 away from the color filter substrate 32, a transparent material which is utilized in the fabricating process of the array substrate, such as SiN, Polyimide, epoxy resin and so on, is utilized to form a protection layer 312 on the bare integrated circuit chips 311 to isolate the bare integrated circuit chips 311 from external environment. Since the protection layer 312 is made of transparent material, transmittance of the LCD panel may not be adversely affected.

Practically, according to some embodiments of the present disclosure, the bare integrated circuit chips 311 and the protection layer 312 may be formed on the side of the base plate 310 away from the color filter substrate 32, then the gate electrode 313, the gate insulating layer 314, the semiconductor active layer 315, the source electrode 316, the drain electrode 317 and the pixel electrode 318 are formed at the side of the base plate 310 facing toward the color filter substrate 32. Alternatively, the gate electrode 313, the gate insulating layer 314, the semiconductor active layer 315, the source electrode 316, the drain electrode 317 and the pixel electrode 318 may be formed at the side of the base plate 310 facing toward the color filter substrate 32, and then the bare integrated circuit chips 311 and the protection layer 312 may be formed on the side of the base plate 310 away from the color filter substrate 32.

An approach of forming the bare integrated circuit chip on the base plate 310 according to some embodiments of the present disclosure can be shown in FIG. 1, and multiple connection parts need to be formed on the base plate 310. In practical production, according to some embodiments of the present disclosure, the bare integrated circuit chip may be formed on other layer of the array substrate. For example, the bare integrated circuit chip may be formed on the pixel electrodes 318, an insulating layer may be formed on the pixel electrodes 318 and multiple connection parts may be formed on the insulating layer.

According to some embodiments of the present disclosure, the bare integrated circuit chips 311 are provided in the color filter substrate 32. Optionally, as shown in FIG. 5, the bare integrated circuit chips 311 are arranged on a side of the base plate 310' of the color filter substrate 32, the side facing toward the array substrate 31. Of course, the bare integrated circuit chips 311 may be arranged on a side of the base plate 310' of the color filter substrate 32, the side being away from the array substrate 31; or the bare integrated circuit chips 311 may be arranged on other layer of the color filter substrate 32, e.g., on the color filter layer 321. The arrangement of the bare integrated circuit chips 311 in the color filter substrate 32 is similar to the arrangement of the bare integrated circuit chips in the array substrate, which is not repeated herein.

Preferably, according to some embodiments of the present disclosure, the bare integrated circuit chips are located in a non-display region of the array substrate, or in a non-display region of the color filter substrate. Practically, electrical connection in silicon-based bare integrated circuit chip are usually of nanometer scale, such small sized bare integrated circuit chip may not affect the transmittance when being directly placed into a display panel having a resolution of hundreds of micrometers. Hence, according to embodiments of the present disclosure, the bare integrated circuit chips can either be placed in the non-display region of the display panel or be placed in a display region of the display panel. By arranging the bare integrated circuit chips in the display panel, space occupied by the bare integrated circuit chips can be reduced and achievement of intelligent transparent or double-sided display can be facilitated.

Figure 6:
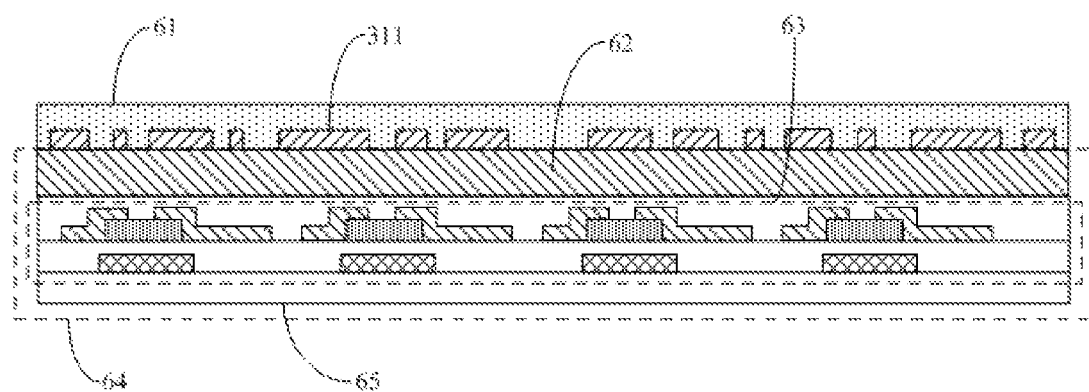
FIG. 6 is a schematic structural diagram of an organic light emitting diode display panel according to some embodiments of the present disclosure.

According to some embodiments of the present disclosure, the display panel is an OLED display panel. As shown in FIG. 6, the OLED display panel according to embodiments of the present disclosure includes a backboard 64 and a cover-board 61 opposite to the backboard 64. The backboard 64 includes a base plate 65, a pixel circuit 63 arranged on the base plate 65 and a light emitting element 62 arranged on the pixel circuit 63.

According to some embodiments of the present disclosure, the bare integrated circuit chips 311 may be arranged in the backboard 64 or in the cover-board 61, or some of the bare integrated chips 311 are arranged in the backboard 64 while others are arranged in the cover-board 61. Preferably, the bare integrated circuit chips 311 are arranged in a non-display region of the backboard 64 or in a non-display region of the cover-board 61. Processes of arranging the bare integrated circuit chips 311 in the backboard 64 or the cover-board 61 are similar to processes of arranging the bare integrated circuit chips 311 in the array substrate 31. Here it is exemplarily described with a case that the bare integrated circuit chips 311 are arranged on the light emitting element 62 of the backboard 64 as shown in FIG. 6.

As shown in FIG. 6, after arranging the bare integrated circuit chips 311 on the light emitting element 62 of the backboard 64, it is unnecessary to provide a protection layer on the bare integrated circuit chips 311, instead the cover-board 61 is directly formed on the bare integrated circuit chips 311. Here, the cover-board 61 can further serve as a protection layer. Of course, in a case that an integrated circuit element requires high insulation from external environment in actual production, a protection layer can be formed on the bare integrated circuit chips 311 firstly and then the cover-board 61 is provided. For bottom-emitting OLED display panel, the protection layer can be made of transparent materials such as SiN, Polymide and epoxy resin, or can be made of non-transparent insulative materials.

A display device is further provided according to some embodiments of the present disclosure, which includes the display panel according to the foregoing embodiments of the present disclosure. The display device may be a liquid crystal panel, a liquid crystal display, a liquid crystal television, and OLED panel, an OLED display, an OLED television, an electronic paper and the like.

In view of the above, embodiments of the present disclosure provide an integrated circuit element, which includes a base plate and multiple connection parts and a bare integrated circuit chip arranged on the base plate. The bare integrated circuit chip includes multiple connection points, and the respective connection parts are electrically connected to the respective connection points according to a one-to-one correspondence. In the embodiments of the present disclosure, the bare integrated circuit chip which is separated from the silicon wafer is directly placed on the base plate, the connection points of the bare integrated circuit chip are electrically connected to the connection parts arranged on the base plate. In this way, unencapsulated bare integrated circuit chip is directly integrated onto the base plate, a conventional encapsulation process is omitted, and the space occupied by the bare integrated circuit chip on the base plate is effectively reduced. In addition, by arranging the integrated circuit chip in the display, achievement of intelligent transparent display can be facilitated.

Obviously, various changes and modifications can be made to the present disclosure by those skilled in the art without departing from the concept and scope of the present disclosure. The present disclosure intends to include all those changes and modification which fall within the scope defined by the list of claims of the present disclosure or equivalent technologies.

The invention claimed is:

1. An integrated circuit element, comprising:
   a base plate, and a plurality of connection parts and a bare integrated circuit chip arranged on the base plate,
   wherein the bare integrated circuit chip comprises a plurality of connection points, and the plurality of connection parts is electrically connected to the plurality of connection points according to a one-to-one correspondence;
   wherein an array substrate or a color filter substrate of a liquid crystal display panel is used as the base plate, or a cover-board of an organic light emitting diode display panel is used as the base plate,
   wherein the bare integrated circuit chip is arranged at a side of the array substrate facing toward the color filter substrate, or the bare integrated circuit chip is arranged at a side of the color filter substrate facing toward the array substrate, or the bare integrated circuit chip is arranged at a side of the cover-board facing toward a backboard, and
   wherein the bare integrated circuit chip is of nanometer scale.

2. The integrated circuit element according to claim 1, further comprising a protection layer that is arranged on the bare integrated circuit chip and covers the base plate, wherein the protection layer is made of transparent material.

3. The integrated circuit element according to claim 2, wherein the bare integrated circuit chip is a bare sensor chip or a bare operation circuit chip.

4. The display panel according to claim 2, wherein the cover-board is used as a protection layer to isolate the bare integrated circuit chip from external environment, wherein the protection layer is made of transparent material.

5. A circuit board, comprising the integrated circuit element according to claim 1.

6. The circuit board according to claim 5, wherein the circuit board is a flexible circuit board or a printed circuit board.

7. A display device, comprising the circuit board according to claim 5.

8. The integrated circuit element according to claim 1, wherein each of the connection parts comprises a connection block and a connection wire, the connection block is electrically connected to the corresponding connection point of the bare integrated circuit chip, and the connection wire is configured to connect the corresponding connection point of the bare integrated circuit chip to elements on the base plate.

9. The display panel according to claim 1, wherein the bare integrated circuit chip is arranged between a base plate of the array substrate and a gate electrode layer that comprises a gate electrode and a gate electrode insulating layer, in a case that the array substrate of the liquid crystal display panel is used as the base plate; or the bare integrated circuit chip is arranged between the base plate of the color filter substrate and a layer where a color filter layer and a black matrix are located, in a case that the color filter substrate of the liquid crystal display panel is used as the base plate; or the bare integrated circuit chip is arranged between the cover-board and a light emitting element, in a case that the cover-board of the organic light emitting diode display panel is used as the base plate.

10. A display panel, comprising a display substrate, wherein a bare integrated circuit chip and a plurality of connection parts are arranged at each of at least one side of the display substrate, and the bare integrated circuit chip comprises a plurality of connection points, wherein the plurality of connection parts and the plurality of connection points at an identical side of the display substrate are electrically connected according to a one-to-one correspondence, wherein the display substrate is an array substrate or a color filter substrate of a liquid crystal display panel, or the display substrate is a cover-board of an organic light emitting di ode display panel, wherein the bare integrated circuit chip is arranged at a side of the array substrate facing toward the color filter substrate, or the bare integrated circuit chip is arranged at a side of the color filter substrate facing toward the array substrate, or the bare integrated circuit chip is arranged at a side of the cover-board facing toward a backboard, and wherein the bare integrated circuit chip is of nanometer scale.

11. The display panel according to claim 10, further comprising a protection layer that is arranged on the bare integrated circuit chip and configured to isolate the bare integrated circuit chip from external environment, wherein the protection layer is made of transparent material.

12. The display panel according to claim 10, wherein the bare integrated circuit chip is located in a display region of the array substrate or in a display region of the color filter substrate, or the bare integrated circuit chip is located in a display region of the cover-board.

13. A display device, comprising the display panel according to claim 10.

14. The display panel according to claim 10, wherein each of the connection parts comprises a connection block and a connection wire, the connection block is electrically connected to the corresponding connection point of the bare integrated circuit chip, and the connection wire is configured to connect the corresponding connection point of the bare integrated circuit chip to elements on the display substrate.

15. The display panel according to claim 10, wherein the bare integrated circuit chip is arranged between a base plate of the array substrate and a gate electrode layer that comprises a gate electrode and a gate electrode insulating layer, when the display substrate is the array substrate of the liquid crystal display panel; or the bare integrated circuit chip is arranged between the base plate of the color filter substrate and a layer where a color filter layer and a black matrix are located, when the display substrate is the color filter substrate of the liquid crystal display panel; or the bare integrated circuit chip is arranged between the cover-board and a light emitting element, when the display substrate is the cover-board of the organic light emitting diode display panel.

16. The display panel according to claim 15, wherein the cover-board is used as a protection layer to isolate the bare integrated circuit chip from external environment, wherein the protection layer is made of transparent material.

17. A fabricating method for an integrated circuit element, comprising:

providing a base plate and forming a plurality of connection parts on the base plate;

separating a bare integrated circuit chip from a silicon wafer using a microtransfer printing process, wherein the bare integrated circuit chip comprises a plurality of connection points; and placing, using a microtransfer printing process, the bare integrated circuit chip that is separated from the silicon wafer onto the base plate having the plurality of connection parts and electrically connecting the plurality of connection parts to the plurality of connection points according to a one-to-one correspondence;

wherein an array substrate or a color filter substrate of a liquid crystal display panel is used as the base plate, or a cover-board of an organic light emitting diode display panel is used as the base plate, wherein the bare integrated circuit chip is arranged at a side of the array substrate facing toward the color filter substrate, or the bare integrated circuit chip is arranged at a side of the color filter substrate facing toward the array substrate, or the bare integrated circuit chip is arranged at a side of the cover-board facing toward a backboard, and wherein the bare integrated circuit chip is of nanometer scale.

18. The fabricating method according to claim 17, wherein after the step of electrically connecting the plurality of connection parts to the plurality of connection points according to the one-to-one correspondence, the fabricating method further comprises:

forming a protection layer that covers the base plate.

19. The fabricating method according to claim 17, wherein the step of forming the plurality of connection parts on the base plate comprises:

depositing a metal film on the base plate; and patterning the metal film to form the plurality of connection parts.

20. The fabricating method according to claim 17, wherein the bare integrated circuit chip is separated from the silicon wafer using a stripping approach in the microtransfer printing process.

* * * * *